United States Patent [19]

Kim

[11] Patent Number: 5,521,546
[45] Date of Patent: May 28, 1996

[54] VOLTAGE BOOSTING CIRCUIT CONSTRUCTED ON AN INTEGRATED CIRCUIT SUBSTRATE, AS FOR A SEMICONDUCTOR MEMORY DEVICE

[75] Inventor: Keum-Yong Kim, Kyungki-do, Rep. of Korea

[73] Assignee: Samsung Electronics Co., Ltd., Suwon, Rep. of Korea

[21] Appl. No.: 337,496

[22] Filed: Nov. 8, 1994

[30] Foreign Application Priority Data

Nov. 9, 1993 [KR] Rep. of Korea .................. 23697/1993

[51] Int. Cl.⁶ ............................................. G05F 3/02
[52] U.S. Cl. ...................... 327/536; 327/535; 327/390
[58] Field of Search ................................. 327/537, 536, 327/535, 534, 530, 589, 390

[56] References Cited

U.S. PATENT DOCUMENTS

| | | | |
|---|---|---|---|
| 4,048,632 | 9/1977 | Spence | 327/109 |
| 4,961,007 | 10/1990 | Kumanoya et al. | 327/537 |
| 5,187,397 | 2/1993 | Nishimori et al. | 327/589 |
| 5,283,764 | 2/1994 | Kim et al. | 365/222 |
| 5,367,489 | 11/1994 | Park et al. | 327/536 |
| 5,408,140 | 4/1995 | Kawai et al. | 327/537 |

OTHER PUBLICATIONS

"A 35 ns 64 Mb Dram Using On–chip Boosted Power Supply", D. J. Lee et al, 1992 Symposium on VLSI Circuits Digest of Technical Papers, pp. 64–65.

*Primary Examiner*—Timothy P. Callahan
*Assistant Examiner*—Terry L. Englund

[57] ABSTRACT

A voltage boosting circuit is constructed together with a semiconductor memory device on a common substrate in an integrated circuit. The voltage boosting circuit comprises a first oscillating circuit, a boosted voltage Vpp main pumping circuit driven by the first oscillating circuit, a transmission gate for supplying Vpp in response to the output of the Vpp main pumping circuit, and a well bias supplying circuit for supplying a given bias to an isolation well on the substrate in which well the transmission gate is formed. The transmission gate includes a field effect transistor switched in common-source-amplifier configuration, rather than in common-drain-amplifier configuration, which mode of switching avoids unwanted voltage offset attributable to source-follower action. In response to drive from a second oscillating circuit, the well bias supplying circuit supplies boosted bias voltage to the isolation well, which (in order to avoid an undesirable latch-up condition) begins before the main pumping circuit boosts the voltage Vpp supplied to the semiconductor memory device as operating potential.

18 Claims, 4 Drawing Sheets

VOLTAGE BOOSTING CIRCUIT CONSTRUCTED ON AN INTEGRATED CIRCUIT SUBSTRATE, AS FOR A SEMICONDUCTOR MEMORY DEVICE

FIELD OF THE INVENTION

The invention relates to a voltage boosting circuit, which raises a power supply voltage Vcc to a desired level thus to supply a boosted voltage Vpp, and more particularly relates to a voltage boosting circuit that can be integrated together with a semiconductor memory device within the confines of a monolithic integrated circuit.

BACKGROUND OF THE INVENTION

In the art, the type of circuitry the present specification refers to as a "voltage boosting circuit" is variously referred to as "boosting circuit", "boosted voltage generating circuit", "Vpp generating circuit", or "bootstrap circuit". "MOS" is an acronym for "metal-oxide-semiconductor"; "PMOS" is an acronym for "p-channel, metal-oxide-semiconductor"; "NMOS" is an acronym for "n-channel metal-oxide-semiconductor"; "FET" is an acronym for "field effect transistor"; and "MOSFET" is an acronym for "metal-oxide-semiconductor field effect transistor". "CMOS" is an acronym for "complementary metal-oxide-semiconductor" and is used to describe an integrated-circuit technology using both p-channel and n-channel MOS field effect transistors. A logic inverter is referred to simply as an "inverter" in this specification and in the claims following this specification.

Generally considered, the information communication in a semiconductor memory device such as dynamic random access memory (DRAM) functions to move an effective potential. The potential in the DRAM constructed in CMOS transistor technology experiences a voltage drop of somewhat more than a threshold voltage of a MOSFET in the process of being transmitted by source-follower action. Such voltage drop causes information loss as well as acting as a considerable drawback in accurately performing data reading and writing operations. To solve such problem, a voltage boosting circuit is used to raise the level of the voltage. Prior-art voltage boosting circuits are disclosed in U.S. Pat. No. 5,367,489 issued 22 Nov. 1994 to Chah-Sok Park et alii, entitled "VOLTAGE PUMPING CIRCUIT FOR SEMICONDUCTOR MEMORY DEVICES" and assigned to Samsung Electronics Co., Ltd.; in a paper entitled "A 35 ns 64 Mb DRAM using On-chip Boosted Power Supply" on pp. 64–65 of 1992 Symposium on VLSI Circuits Digest of Technical Papers published in Korea; and in U.S. Pat. No. 4,704,706 issued to the Fujitsu company in Japan.

FIG. 1 is a circuit diagram illustrating construction of portions of a conventional voltage boosting circuit. In the figure, the voltage boosting circuit includes a transmission-gate transistor 18 which drives and transmits a boosted voltage Vpp from a boosting node 16 to a semiconductor memory device 19. In addition, the circuit has pumping capacitor 14 for pumping the Vpp, drivers 10 and 12 which supply the power supply to the pumping capacitor 14, and an oscillating circuit 9 which drives the cascaded drivers 10 and 12. A precharging circuit which initially precharges connecting nodes 8 and 16 to the power supply voltage Vcc level applied to the drivers 2, 4, 10 and 12 is also included in the circuitry, but is omitted from FIG. 1 because it does not relate to the problem to be solved by the invention.

In operation, upon power-up of a monolithic integrated circuit or the beginning of an active cycle, the oscillating circuit 9 starts to oscillate whenever the boosted voltage Vpp falls below a prescribed level. The connecting nodes 8 and 16 are initially precharged to the power supply voltage Vcc level applied to the drivers 2, 4, 10 and 12. The drivers 10 and 12 amplify the oscillating signal of the oscillating circuit 9 such that the output signal of the driver 12 is alternately switched between ground and Vcc potentials. When the output signal of the driver 12 switches to Vcc potential, this causes the pre-charged pumping capacitor 14 to raise the potential of the connecting node 16 to a level approximately equal twice the operating potential Vcc. Such a pumping operation will be performed in the drivers 2 and 4 and a pumping capacitor 6, in the same manner as discussed above, thereby raising a voltage of the connecting node 8 to a peak level approximately equal twice the operating potential Vcc. Thereafter, the peak voltage that the connecting node 8 is charged to is applied via the source-follower action of transmission-gate transistor 18 to the semiconductor memory device 19 as a boosted voltage Vpp.

In this manner, a boosted voltage Vpp level of 2 Vcc–Vth (wherein Vth represents the threshold voltage of the transistor 18) can be obtained. Thus, when the power supply voltage Vcc level is high (assuming that the Vcc level is over 3 volts), the boosted voltage Vpp level typically exceeds approximately Vcc+ 1.5 volts as a desired level, so that loss of the threshold voltage Vth caused by the transmission-gate transistor 18 not being fully conductive does not matter. However, if the Vcc level is below 3.0 volts, the voltage drop caused by the threshold voltage Vth in the Vpp level equal to 2 Vcc–Vth is relatively large, so there is difficulty in obtaining the full boosted voltage Vpp level when Vcc is low in level. Currently, the need to ensure punch-through gain places a lower limit on the value to which Vth can be reduced. The voltage boosting circuit as shown in FIG. 1 suffers from disadvantages in assuring its reliability, then, since appropriate action cannot be taken when the power supply voltage Vcc falls to low potential.

A voltage boosting circuit which assures high reliability despite low power supply voltage was sought by the inventor. A voltage boosting circuit which supplies a higher boosted voltage Vpp under low power supply voltage conditions was sought. A voltage boosting circuit which supplies a boosted voltage Vpp without occurrence of substantial voltage drop in the channel of a transmission-gate transistor was sought.

SUMMARY OF THE INVENTION

According to an aspect of the invention, a voltage boosting circuit is provided for a semiconductor memory device, which voltage boosting circuit supplies a boost voltage that is raised to a desired level even under low power supply voltage conditions. The circuit includes a boost voltage Vpp main pumping circuit driven by a first oscillating circuit, a transmission device which supplies the boost voltage Vpp in response to the output of the Vpp main pumping circuit, and a well bias supplying circuit. In response to the driving of a second oscillating circuit, the well bias supplying circuit supplies a given bias to an isolation well on a substrate in which isolation well the transmission-gate transistor is formed. This bias potential is offset from substrate reference potential by a boosted voltage Vpp substantially twice the normal operating supply voltage Vpp.

A feature of a voltage boosting circuit constructed in accordance with the invention is that the transmission-gate transistor which supplies the boosted voltage Vpp is a PMOS transistor constructed within an isolation well biased by the well bias supplying circuit. The PMOS transmission-gate transistor is operated as a common-source amplifier, rather than as a common-drain amplifier, when switching its channel into conduction. This prevents the occurrence of a voltage drop in the channel that otherwise occurs owing to source-follower action.

Moreover, in a voltage boosting circuit constructed in accordance with the invention, during an active cycle the well bias supplying circuit supplies a given bias to the well of the transmission-gate transistor before the pumping operation to generate the boosted voltage Vpp is begun. This avoids an undesirable latch-up condition caused by parasitic p-n-p bipolar transistor action involving the p-type substrate, the n-type isolation well and the PMOS transmission-gate transistor.

BRIEF DESCRIPTION OF THE DRAWING

A more complete appreciation of the invention, and many of the attendant advantages thereof, will be readily enjoyed as the same becomes better understood by reference to the following detailed description when considered in conjunction with the accompanying drawing comprising figures as listed below, in which figures like numbers indicate the same or similar components.

PMOS FETs are indicated by small circles at their gate electrode connections; FETs without small circles at their gate electrode connections are NMOS FETs.

DETAILED DESCRIPTION

In the following description, it is apparent to those skilled in the art that the disclosed invention will be easily embodied without specific details such as transmission-gate transistor, well bias supplying circuit, and Vpp main pumping circuit, etc. employed being required for the overall understanding of the invention or straightforward modifications thereof.

The term "well bias supplying circuit" used in this specification refers to a circuit that supplies a desired or given bias to a corresponding isolation well or bulk on the substrate in which a specific element or circuit is formed. Further, the term "Vpp main pumping circuit" is a circuit that substantially pumps or boosts the output voltage Vpp above the normal operating voltage Vcc in the voltage boosting circuit, comprising at least a pumping capacitor across which the difference between the Vpp and Vcc potentials is maintained by the charge stored between the plates of that pumping capacitor. The term "voltage boosting circuit" applied to the overall invention comprehends all circuits associated with a voltage boosting operation.

Figure 1:
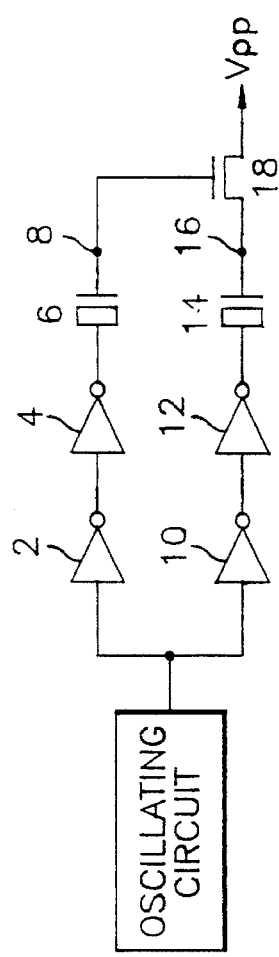
FIG. 1 is a schematic circuit diagram illustrating the construction of a conventional voltage boosting circuit used in combination with a semiconductor memory device.
Figure 2:
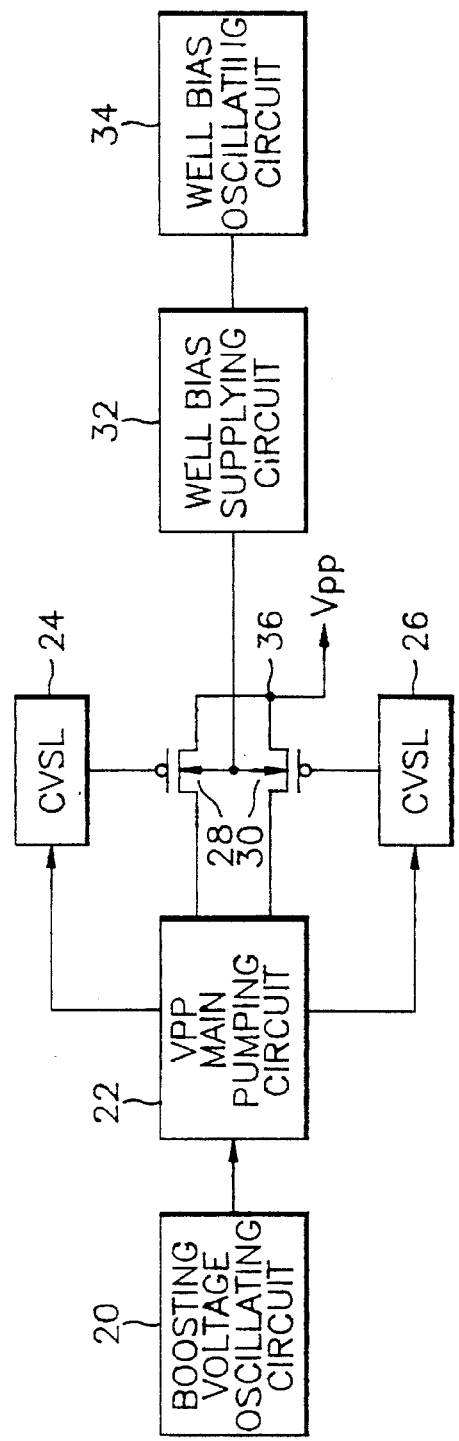
FIG. 2 is a schematic block diagram illustrating a construction of a voltage boosting circuit according to the present invention, which can replace the conventional voltage boosting circuit used in combination with a semiconductor memory device.

FIG. 2 is a schematic block diagram showing a voltage boosting circuit constructed in accordance with the invention for supplying boosted voltage Vpp for application to the semiconductor memory device 19 in place of the FIG. 1 prior-art voltage boosting circuit. The semiconductor memory device 19 is assumed to be constructed on a p-type substrate using NMOS transistors in its construction, although (as one skilled in the art will appreciate) it could alternatively be constructed on an insulating substrate, using a silicon-on-sapphire technology, for example. The FIG. 2 voltage boosting circuit is constructed on the same substrate within the confines of the same monolithic integrated circuit.

The FIG. 2 voltage boosting circuit includes a boosting voltage oscillating circuit 20 for generating a clock having a predetermined period, when the integrated circuit is powered-up or when the boost voltage Vpp falls below a desired level, a Vpp main pumping circuit 22 for receiving the output signal of the oscillating circuit 20 and for pumping up from the normal operating voltage Vcc to generate a desired boost voltage Vpp, PMOS transmission-gate transistors 28 and 30 for alternately transmitting the output of the Vpp main pumping circuit 22, CVSL (cascade voltage switching logic) circuits 24 and 26 for controlling switching operation of the PMOS transmission-gate transistors 28 and 30 in response to the output signal of the Vpp main pumping circuit 22, a well bias supplying circuit 32 for supplying a predetermined bias to the isolation well(s) in which the channels of the PMOS transmission-gate transistors 28 and 30 are formed, a well bias oscillating circuit 34 for generating a clock having a predetermined period to drive the well bias supplying circuit 32 when the monolithic integrated circuit is powered-up or the boost voltage Vpp falls below a desired level, and a boosting node 36 connected to the drain terminals of the PMOS transmission-gate transistors 28 and 30 for supplying the desired Vpp.

Details of the construction of the FIG. 2 voltage boosting circuit will now be described. Firstly, assuming that the circuitry is constructed on a p-type substrate, a principal feature of the construction of the FIG. 2 voltage boosting circuit is that the transmission-gate transistors 28 and 30 are respectively constructed as PMOS transistors within an n-type isolation well or within respective n-type isolation wells, and the well bias supplying circuit 32 supplies a predetermined bias to the isolation well(s) that the PMOS transmission-gate transistors 28 and 30 are constructed in. The boosting voltage oscillating circuit 20 and the well bias oscillating circuit 34 can be oscillating circuits of a type or types previously known in the art. For example, the oscillating circuit described by the inventor in U.S. Pat. No. 5,283,764 issued to him 1 Feb. 1994, entitled "REFRESH TIMER FOR PROVIDING A CONSTANT REFRESH TIMER REGARDLESS OF VARIATIONS IN THE OPERATING VOLTAGE" and assigned to Samsung ElectronicsCo., Ltd., is suitable. Also, the Vpp main pumping circuit 22 can be of a type known in the art, but the fact that the CVSL circuits 24 and 26 are controlled within the construction thereof has to be considered of course.

To achieve stable and reliable boosting operation with the FIG. 2 structure, the well bias oscillating circuit 34 and the well bias supplying circuit 32 should supply the predetermined bias to the well(s) of the PMOS transmission-gate transistors before the pumping operation begins. To fulfill this purpose, the well bias oscillating circuit 34 begins oscillating operation before the boosting voltage oscillating circuit 20 does. A VccH signal is a signal enabled when the power source voltage Vcc is raised to a desired voltage level, as disclosed in U.S. Pat. No. 5,283,764. The CVSL circuit 24 of FIG. 2 is only illustrative of how control is applied to the PMOS transmission-gate transistor 28 in a representative embodiment for the invention, and the CVSL circuit 24 can be replaced by other control circuitry in other embodiments of the invention.

In operation, during the power-up of an integrated circuit to which the power supply voltage Vcc is initially supplied, the well bias oscillating circuit 34 is activated, and the well bias supplying circuit 32 is driven in response thereto. Then, the well voltages of the PMOS transmission-gate transistors 28 and 30 are generated by the well bias supplying circuit 32. Here, the objective of applying the voltages to the well(s) of the PMOS transmission-gate transistors 28 and 30 is to operate the voltage boosting circuit stably according to the invention using the PMOS transmission-gate transistors 28 and 30, which will be discussed in detail with reference to FIG. 3. Then, when the VccH signal is enabled, the boosting voltage oscillating circuit 20 is activated and the Vpp main pumping circuit 22 enables the Vpp to be raised to the desired level. The pumped boosting voltages are transmitted as boost voltage Vpp to the boosting node 36 through the channel of the PMOS transmission-gate transistors 28 and 30 which are alternated in conduction under the control of respective gate potentials respectively supplied by the CVSL circuits 24 and 26. Here, the alternately conductive operation of the PMOS transmission-gate transistors 28 and 30 serves to improve the constancy of boosting effect and to avoid ripple under load. It is noted that the Vpp supplied from the Vpp main pumping circuit 22 is transmitted to the boosting node 36 without substantial voltage drop therein. This is because the transmitting process is achieved by the common-source-amplifier operating characteristics of the PMOS transmission-gate transistors 28 and 30, rather than the common-drain-amplifier operating characteristics of NMOS transmission-gate transistors. The boosted voltage Vpp applied to the boosting node 36 is supplied to a specific circuit on the same integrated circuit (e.g., the semiconductor memory device 19). Whenever the Vpp level falls below the desired level, a detector (not shown) detects the lowered Vpp level and thereafter a series of the processes mentioned above are repeated.

Figure 3:
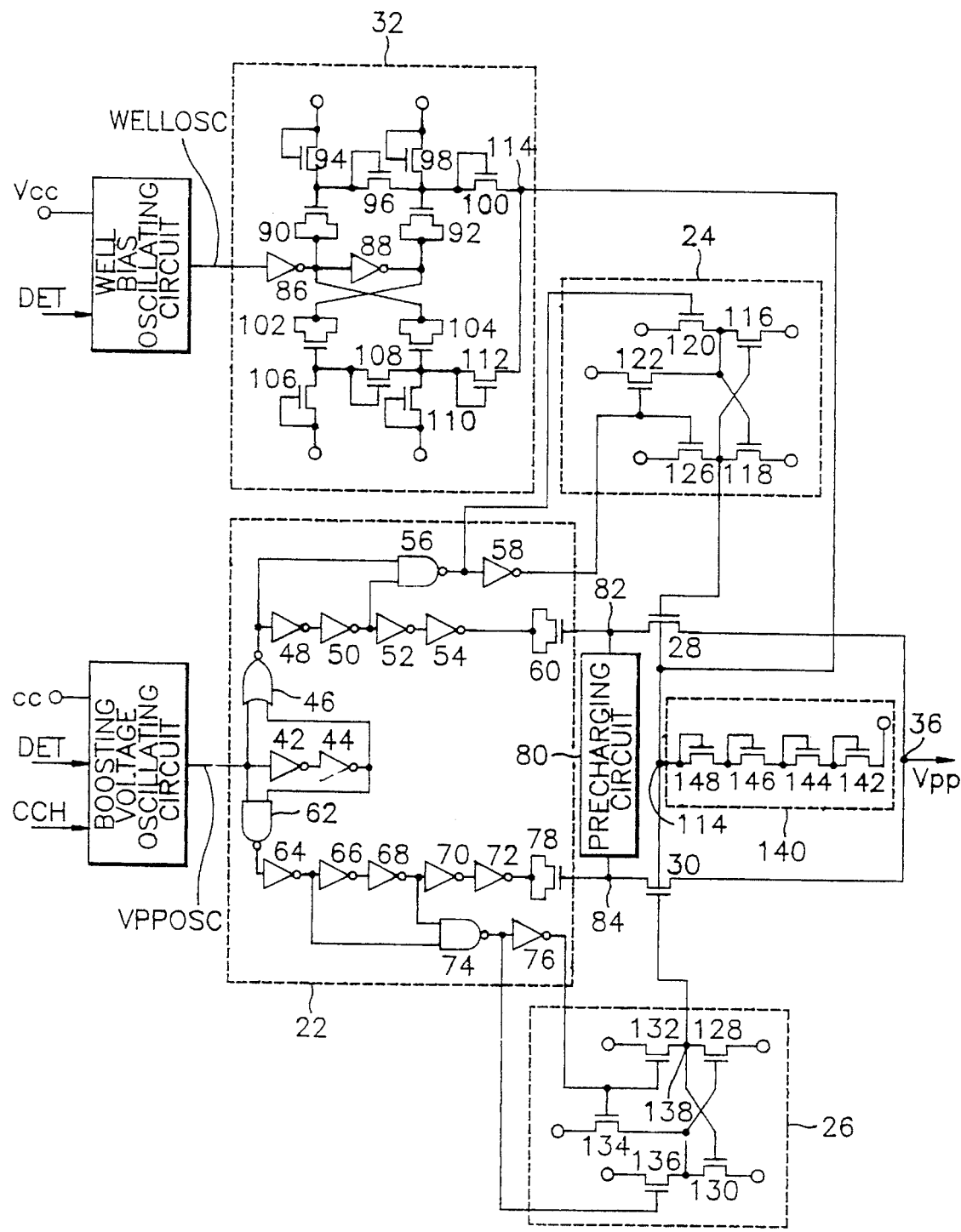
FIG. 3 is a detailed circuit diagram illustrating the voltage boosting circuit of FIG. 2.

FIG. 3 is a detailed circuit diagram showing representative construction of a portion of the FIG. 2 voltage boosting circuit. As the boosting voltage oscillating circuit 20 and the well bias oscillating circuit 34 of the FIG. 2 voltage boosting circuit are well known, detailed description of their constructions is omitted. The general structure in FIG. 3 is same as that of FIG. 2, except for this omission and except that a precharging circuit 80 for precharging pumping nodes 82 and 84 is explicitly shown in FIG. 3. In FIG. 3 oscillation signal or output signal from the boosting voltage oscillating circuit 20 is designated as a signal VPPOSC, and the output signal of the well bias oscillating circuit 34 is designated as a signal WELLOSC.

In FIG. 3 the Vpp main pumping circuit 22 includes circuitry of the following nature. A NOR gate 46 receives the output signal VPPOSC from the boosting voltage oscillating circuit 20 both directly and as delayed by cascaded inverters 42 and 44. A NAND gate 56 receives the response of the NOR gate 46 both directly and as delayed by cascaded inverters 48 and 50; and the response of the NAND gate 56 is complemented by an inverter 58. The response of the NAND gate 56 and the complemented response from the inverter 58 are supplied to the CVSL circuit 24 as input signals thereto. The response of the NOR gate 46 as delayed by cascaded inverters 42 and 44 is further delayed by cascaded inverters 52 and 54 and then is applied to a first plate of a pumping capacitor 60, the second plate of which connects to a node 82 to which the source of the PMOS FET 28 also connects. The cascaded inverters 52 and 54 together provide a non-inverting amplifying circuit for driving the pumping capacitor 60 in response to the output of the NOR gate 46, as delayed by cascaded inverters 48 and 50. A NAND gate 62 also receives the output signal VPPOSC from the boosting voltage oscillating circuit 20 both directly and as delayed by cascaded inverters 42 and 44; and the response of the NAND gate 62 is complemented by an inverter 64. A NAND gate 74 receives the complemented NAND gate 62 response from the inverter 64 both directly and as delayed by cascaded inverters 66 and 68; and the response of the NAND gate 74 is complemented by an inverter 76. The response of the NAND gate 74 and the complemented response from the inverter 76 are supplied to the CVSL circuit 26 as input signals thereto. The complemented NAND gate 62 response from the inverter 64 as delayed by cascaded delay circuits 66 and 68 is further delayed by cascaded delay circuits 70 and 72 and then is applied to a first plate of a pumping capacitor 78, the second plate of which connects to a node 84 to which the source of the PMOS FET 30 also connects. The cascaded inverters 70 and 72 together provide a non-inverting amplifying circuit for driving the pumping capacitor 78 in response to the complemented output of the NAND gate 46 supplied by the inverter 64 and delayed by the cascaded inverters 66 and 68.

A precharging circuit 80, which applies pre-charges to the nodes 82 and 84, is of a type known in the prior art. For example, the precharging circuit 80 can be as described in U.S. Pat. No. 5,367,489. In the prior art, the pumping nodes 82 and 84 are each precharged to the power supply voltage Vcc level. The CVSL circuits 24 and 26 are alike in their respective construction, each conforming to a known latch configuration. The CVSL circuits 24 and 26 supply signals to the gate electrodes of the transmission-gate transistors 28 and 30, respectively, for controlling the conduction of the channels of transistors 28 and 30.

The well bias supplying circuit 32 includes a cascade connection of an inverter 88, the output signal of which complements the output signal WELLOSC from the well bias oscillating circuit 32, and an inverter 86, the output signal of which replicates the signal WELLOSC. The well bias supplying circuit 32 also includes two capacitors 90 and 104, respective first plates of which connect to an output terminal of the inverter 86, and two capacitors 92 and 102, respective first plates of which are connected to the output signal of the inverter 88. The well bias supplying circuit 32 also includes FETs 94, 98, 106 and 110 connected as resistors for referring respective second plates of the capacitors 90, 92, 102 and 104 each to a direct bias voltage. The well bias supplying circuit 32 also includes a diode-connected FET 96 between respective second plates of the capacitors 92 and 92, a diode-connected transistor 100 between the second plate of the capacitor 92 and a well node 114, a diode-connected transistor 108 between the respective second plates of the capacitors 102 and 104, and a diode-connected transistor 112 between the second plate of the capacitor 104 and the well node 114. The well node 114, is provided with a clamping circuit 140 which precharges or initializes the well node 114 and also clamps the voltage loaded in the well node 114 so as not to exceed a Vcc+4Vth level. The clamping level is limited to the Vcc+4Vth level by diode-connected clamping transistors 142, 144, 146, and 148, which level can be varied by changing the number of diode-connected clamping transistors in the clamping circuit 140 and varying the length/width ratio of their channels.

It is desirable that an additional device for performing initializing and precharging operations should be provided for the boosting node 36. This device is not explicitly shown in FIG. 3 and can take a form as known in the art.

Figure 4:
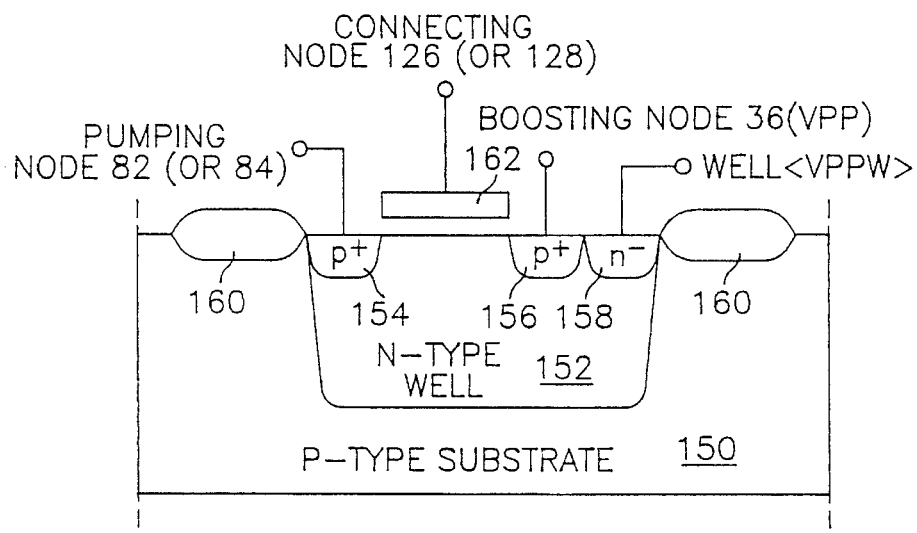
FIG. 4 is a sectional view illustrating a construction which supplies a given bias to the isolation wells of the transmission-gate transistors of FIG. 3.

FIG. 4 is a sectional view showing a construction which supplies a given bias to the isolation well(s) of the transmission-gate transistors 28 and 30 of FIG. 3. FIG. 4 may help the reader to gain a thorough understanding of the invention. In FIG. 4, an n-well 152 is formed on a p-type substrate 150; and p+ region 154, p+ region 156 and n+ region 158 are formed in the n-well 152. Field oxide layers 160 are respectively disposed at both sides of the n-well 152. The channel of the transmission-gate transistors 28 or 30 is induced between the p+ regions 154 and 156 by potential applied to a gate electrode 162 insulated from the channel by an interposing oxide layer 164. With such construction, the pumping node 82 or 84 is connected to the p+ region 154 by a contacting conductor, and the boosting node 36 supplying the Vpp is connected to the p+ region 156 by a contacting conductor. Further, the well node 114 where a signal WELL<VPPW> is supplied is connected to the n+ region 158 by a contacting conductor, and the connecting node 126 or 138 is connected to the gate electrode 162 by a conductor. The conductors may be formed by metalization or by highly doped polycrystalline silicon.

In an alternative to the construction described above, the n-well 152 can be embodied as an n-well formed in a p-well formed on an n-type substrate.

It is apparent to those skilled in the art that a latch-up phenomenon caused by occurrence of a parasitic bipolar transistor action has to be considered in circuitry constructed using CMOS technology. To increase protection against latch-up, it is desirable to lower the current amplification ratio of the parasitic bipolar and to lower substrate and well resistance. Returning to FIG. 3, since the transmission-gate transistors 28 and 30 are respectively constructed as PMOS transistors, when performing the pumping operation of the Vpp, there is a problem that forward biases can be simultaneously applied between the n-well 152 and both the p+ regions 154 and 156 in FIG. 4. In this case, it is likely that a normal operation cannot be performed in the circuit of FIG. 3 owing to the latch-up phenomenon caused by parasitic bipolar transistor action. Therefore, to forestall such problem occurring, before the pumping operation of the Vpp is executed, the well bias is supplied to the well(s) of the transmission-gate transistors 28 and 30.

Figure 5:
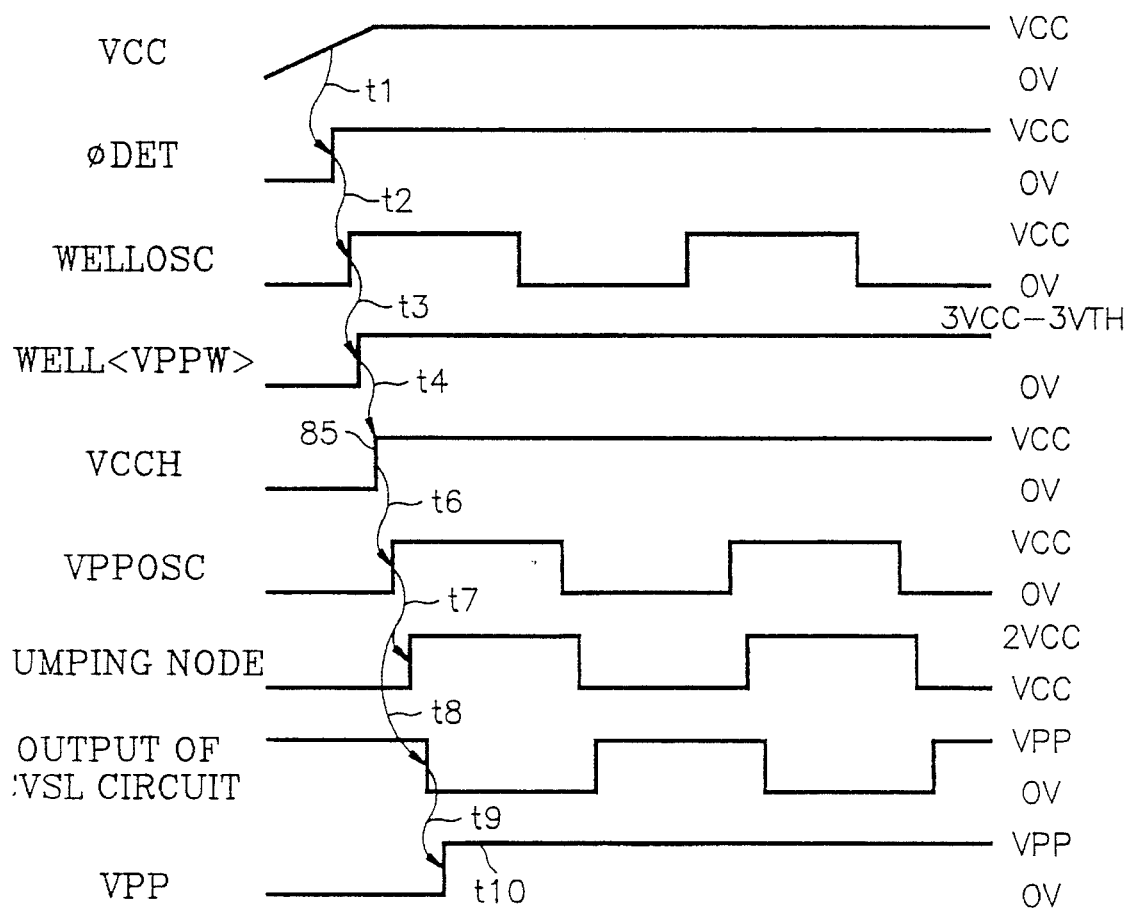
FIG. 5 is a timing diagram showing signals occurring during the operation of the FIG. 3 circuit.

FIG. 5 is a timing diagram showing signals encountered in the operation of the FIG. 3 voltage boosting circuit. Now, description of the operational characteristics of FIG. 3 will be made with respect to FIG. 5. Initially, when a monolithic integrated circuit is powered-up and the power supply voltage Vcc is applied (before the VccH is enabled to a "high" level), an output signal φDET of a Vpp detector (not shown) activated when the Vpp level is lower than a prescribed level (i.e., below Vcc-Vth level) is enabled from a "low" level to the "high" level (step t1 of FIG. 5). Thereafter, the well bias oscillating circuit 34 is activated to supply the oscillating signal WELLOSC (step t2). From the oscillating signal WELLOSC the well bias supplying circuit 32 is activated (step t3) to supply the well voltage WELL<VPPW> to the transmission-gate transistors 28 and 30 (step t4). Here, the well bias supplying circuit 32 receives the oscillating signal WELLOSC of the well bias oscillating circuit 34 and executes a double pumping operation as the output signal WELLOSC is toggled. Thus, the output of the well bias supplying circuit 32 has 3Vcc–3Vth level. At this time, if the output level of the well bias supplying circuit 32 tends to exceed Vcc+4Vth level, the voltage level of the well node 114 is clamped by the clamping circuit 140. Particularly, it is noted that the enabling state of well bias WELL<VPPW> as shown in step t4 means that the well bias is previously supplied to the well(s) of the transmission-gate transistors 28 and 30, before the Vpp main pumping circuit 22 performs its pumping operation. Subsequently, when the Vcc is raised to its prescribed level, if the VccH is enabled to the "high" level and simultaneously the output signal φDET is enabled to the "high" level (step t5), the boosting voltage oscillating circuit 20 is activated (step t6). A signal VPPOSC is thereby generated, and the Vpp main pumping circuit 22 performs the pumping operation of the Vpp. That is, if the signal VPPOSC is enabled to the "low" level, the pumping capacitor 60 executes the pumping operation through the NOR gate 46 and the cascaded inverters 48, 50, 52, and 54. The pumping node 82 precharged to the Vcc level by the precharging circuit 80 is pumped to a 2Vcc level (step t7). Here, when the output signal of the CVSL circuit 24 is enabled to 0 volt in the Vpp level, with phase opposite to that of signal at the pumping node 82 (step t8), the 2Vcc level of pumping node 82 allows the Vpp of the boosting node 36 to be raised to the 2Vcc level through channel of the transmission-gate transistor 28 (step t9). Then, if the signal VPPOSC is enabled to the "low" level, the pumping capacitor 78 executes the pumping operation through the NAND gate 62 and the cascaded inverters 64, 66, 68, 70 and 72. The pumping node 84 precharged to the Vcc level by the precharging circuit 80 is pumped to the 2Vcc level (step t7). Here, when the output signal of the CVSL circuit 26 is enabled to be 0 volt in the Vpp level, with phase opposite to that of signal at the pumping node 84 (step t8), the 2Vcc level of the pumping node 84 allows the Vpp of the boosting node 36 to be raised to the 2Vcc level through the channel of the transmission-gate transistor 30 (step t9). The pumping capacitors 60 and 78 are operated in response to the toggling input of the signal VPPOSC as set forth above, so that a desired Vpp can be obtained by repeating a series of steps discussed above (step t10). Here, since the well bias is previously supplied to the well(s) of the transmission-gate transistors 28 and 30 by the well bias supplying circuit 32, before the Vpp main pumping circuit 22 performs the pumping operation, a normal boosting operation is executed without the occurrence of the latch-up phenomenon.

If Vpp level falls, owing to active operation of many of the circuits on the same monolithic integrated circuit chip, there occurs a series of the operational processes of FIG. 5 to boost the Vpp level up. These operational processes are performed in the same manner that has been explained with regard to the power-up of the monolithic integrated circuit including the voltage boosting circuit.

Figure 6:
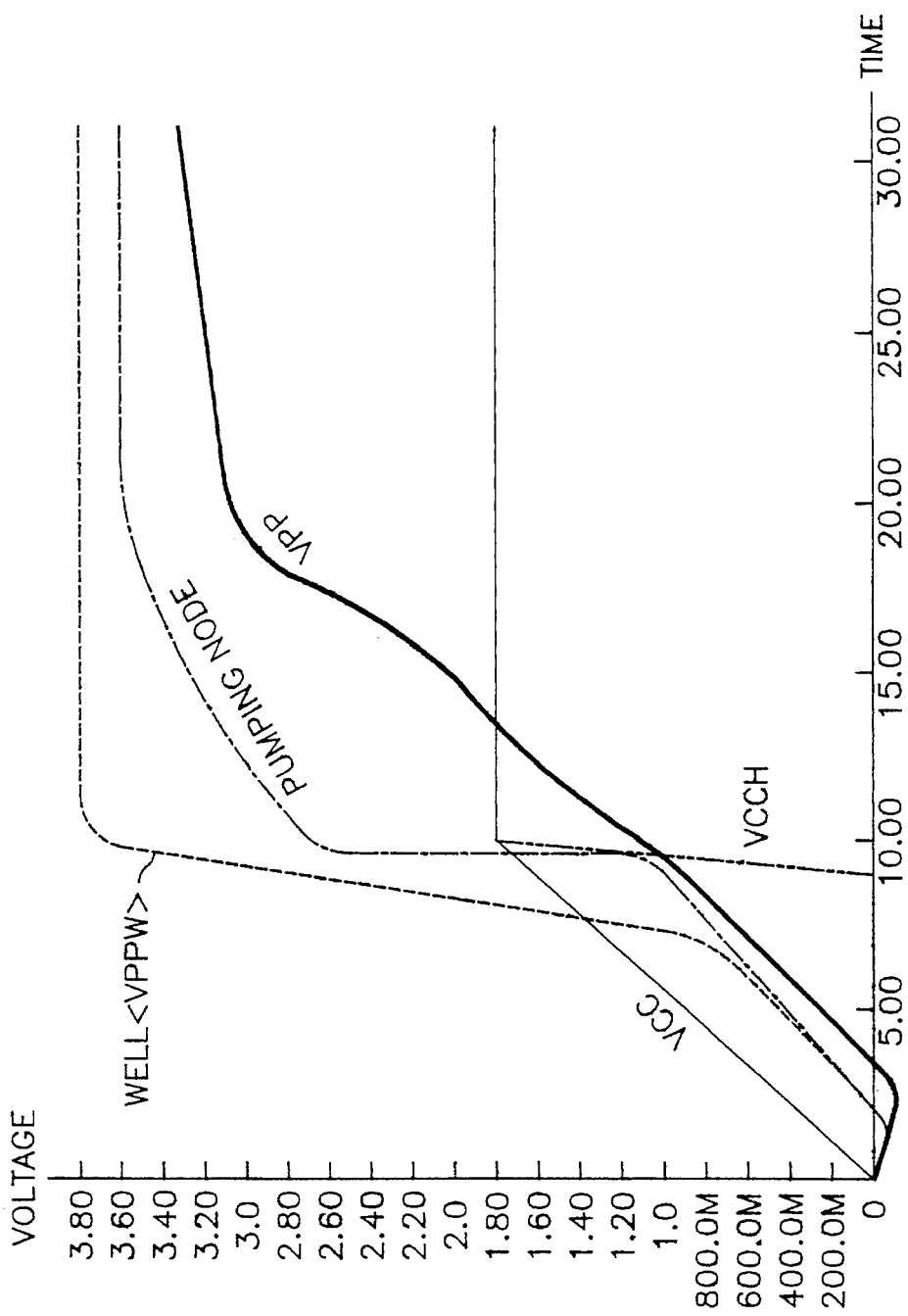
FIG. 6 is a graph illustrating waveforms for a boosting effect in the voltage boosting circuit according to the present invention.

FIG. 6 is a graph illustrating wave forms for a boosting effect in the voltage boosting circuit according to the invention, which graph was derived through computer simulation of the invention. In the figure, when the Vcc is enabled from 0 volt to 1.8 volts, if the Vcc becomes approximately 1.6 volts, the output signal WELL<VPPW> of the well bias supplying circuit 32 is above 3.6 volts. VccH is enabled when the Vcc reaches a stable level, that is, 1.8 volts; and this activates the boosting voltage oscillating circuit 20. The activation of the boosting voltage oscillating circuit 20 drives the pumping nodes 82 and 84 to 2Vcc peak level, and the operation of the transmission-gate transistors 28 and 30 alternately apply these 2Vcc peak levels to the boosting node 36 to maintain Vpp at 3.6 volts. As implicit in FIG. 6, the voltage boosting circuit according to the invention can reach after 20 microseconds or so a substantially constant Vpp level even when the power supply voltage Vcc is low.

FIG. 2 is a schematic block diagram illustrating a preferred embodiment according to the principle of the present invention and FIG. 3 is a detailed circuit diagram of FIG. 2, which shows a preferred embodiment according to the present invention with reference to the timing diagram illustrated in FIG. 5. One skilled in the art will understand that the invention may be practiced using circuit configurations differing from the specific one shown in FIG. 3. One skilled in the art will also appreciate that while the boosting voltage oscillating circuit and the well bias oscillating circuit may be constructed using separately energized oscillators, with operating power being supplied to the boosting voltage oscillating circuit with some delay after operating power is supplied to the well bias oscillating circuit, alternatively the boosting voltage oscillating circuit and the well bias oscillating circuit may be constructed so as to derive two sets of oscillations from a common oscillator. Using delayed switching, the onset of applying oscillations to the boosting voltage main pumping circuit is then delayed respective to the onset of applying oscillations to well bias supplying circuit. While the invention is described as it relates to circuitry constructed on p-type substrate with the transmission-gate FETs being of PMOS type constructed in n-wells, one skilled in the art will understand that the invention is equally applicable to circuitry constructed on n-type substrate with the transmission-gate FETs being of NMOS type constructed in p-wells. The claims which follow should be construed as being of sufficient scope to include such alternative constructions which utilize the principles taught in the foregoing specification.

What is claimed is:

1. A voltage boosting circuit in a semiconductor memory device, comprising:

a boosting node for supplying a boosting voltage Vpp;

first and second PMOS transmission-gate transistors, having respective drains connected to said boosting node, having respective sources and having respective gates, each of said first and second PMOS transmission-gate transistors constructed within respective wells of n-type semiconductor material;

a boosting voltage oscillating circuit for supplying first oscillations;

a boosting voltage main pumping circuit responsive to said first oscillations for pumping respective boosting voltages to the source electrodes of said first and second PMOS transmission-gate transistors;

means responsive to said first oscillations for applying control signals to the gates of said first and second PMOS transmission-gate transistors for alternately transmitting to said boosting node respective boosting voltages pumped to their sources by said boosting voltage main pumping circuit;

a well bias oscillating circuit for supplying second oscillations from a time previous to said boosting voltage oscillating circuit supplying said first oscillations; and a well bias supplying circuit for supplying, in response to said second oscillations, a bias potential to the well of each of said first and second transmission-gate transistors, which bias potential has at least a prescribed value beginning from a time before said boosting voltage main pumping circuit executes a pumping operation.

2. The voltage boosting circuit recited in claim 1, wherein said boosting voltage main pumping circuit comprises:

a NOR gate for receiving said first oscillations from said boosting voltage oscillating circuit, both directly and as delayed by a first delay circuit, and generating a NOR gate response as an output signal therefrom;

a first NAND gate for receiving the output signal of said NOR gate, both directly and as delayed by a second delay circuit, and generating a first NAND gate response as an output signal therefrom;

a first inverter for receiving the output signal of said first NAND gate complementing said first NAND gate response;

a first cascade voltage switching logic circuit responsive to the output signal from said first NAND gate and the complemented first NAND gate response from said first inverter for generating the control signal applied to the gate of said first PMOS transmission-gate transistor;

a first amplifying circuit, having an input terminal for receiving the output signal of said NOR gate as delayed by said second delay circuit, and having an output terminal;

a first pumping capacitor having a first plate connected to the output terminal of said first amplifying circuit and having a second plate connected to the source of said first PMOS transmission-gate transistor;

a second NAND gate for receiving said first oscillations from said boosting voltage oscillating circuit, both directly and as delayed by said first delay circuit, and generating a second NAND gate response as an output signal therefrom;

a second inverter for receiving the output signal of said second NAND gate and complementing said second NAND gate response in an output signal therefrom;

a third NAND gate for receiving the output signal of said second inverter, both directly and as delayed by a third delay circuit, and generating a third NAND gate response as an output signal therefrom;

a third inverter for receiving the output signal of said third NAND gate and complementing said third NAND gate response;

a second cascade voltage switching logic circuit responsive to the output signal from said third NAND gate and the complemented third NAND gate response from said third inverter for generating the control signal applied to the gate of said second PMOS transmission-gate transistor;

a second amplifying circuit, having an input terminal for receiving the output signal of said second inverter as delayed by said third delay circuit, and having an output terminal; and a second pumping capacitor having a first plate connected to the output terminal of said second amplifying circuit and and having a second plate connected to the source of said second PMOS transmission-gate transistor.

3. The voltage boosting circuit recited in claim 1, wherein said well bias supplying circuit comprises:

a first inverter connected for receiving said second oscillations from said well bias oscillating circuit and supplying an inverted response to said second oscillations as an output signal therefrom;

a second inverter in cascade connection with said first inverter for receiving its said inverted response to said second oscillations and supplying a twice-inverted response to said second oscillations as an output signal therefrom;

first and second capacitors having respective first plates connected together to receive the output signal of said first inverter and having respective second plates;

third and fourth capacitors having respective first plates connected together to receive the output signal of said second inverter and having respective second plates;

respective resistive elements for applying bias voltage to the second plates of said first, second, third end fourth capacitors;

a first diode-connected transistor, connected between the second plate of said first capacitor and the second plate of said third capacitor, and poled for applying charged voltage at the second plate of said first capacitor to the second plate of said third capacitor when the charged voltage at the second plate of said first capacitor sufficiently exceeds voltage at the second plate of said third capacitor;

a second diode-connected transistor, connected between the second plate of said third capacitor and each isolation well of said first and second PMOS transmission-gate transistors, and poled for applying charged voltage at the second plate of said third capacitor to each said isolation well when bias potential thereon is sufficiently exceeded by the charged voltage at the second plate of said third capacitor;

a third diode-connected transistor, connected between the second plate of said fourth capacitor and the second plate of said second capacitor, and poled for applying charged voltage at the second plate of said fourth capacitor to the second plate of said second capacitor when the charged voltage at the second plate of said fourth capacitor sufficiently exceeds voltage at the second plate of said second capacitor; and a fourth diode-connected transistor, connected between the second plate of said second capacitor and each said isolation well, and poled for applying charged voltage at the second plate of said second capacitor to each said isolation well when bias potential thereon is sufficiently exceeded by the charged voltage at the second plate of said second capacitor.

4. The voltage boosting circuit recited in claim 1, further comprising a clamping circuit which initializes the bias potential at each said isolation well and also clamps the voltage transmitted thereto so as not to exceed a prescribed level.

5. The voltage boosting circuit recited in claim 1 wherein the respective wells of n-type semiconductor material that said first and second PMOS transmission-gate transistors are constructed within are separate from each other.

6. The voltage boosting circuit recited in claim 1 wherein the respective wells of n-type semiconductor material that said first and second PMOS transmission-gate transistors are constructed within are portions of a single well.

7. The voltage boosting circuit recited in claim 2 wherein the respective wells of n-type semiconductor material that said first and second PMOS transmission-gate transistors are constructed within are separate from each other.

8. The voltage boosting circuit recited in claim 2 wherein the respective wells of n-type semiconductor material that said first and second PMOS transmission-gate transistors are constructed within are portions of a single well.

9. The voltage boosting circuit recited in claim 3 wherein the respective wells of n-type semiconductor material that said first and second PMOS transmission-gate transistors are constructed within are separate from each other.

10. The voltage boosting circuit recited in claim 3 wherein the respective wells of n-type semiconductor material that said first and second PMOS transmission-gate transistors are constructed within are portions of a single well.

11. The voltage boosting circuit recited in claim 4 wherein the respective wells of n-type semiconductor material that said first and second PMOS transmission-gate transistors are constructed within are separate from each other.

12. The voltage boosting circuit recited in claim 4 wherein the respective wells of n-type semiconductor material that said first and second PMOS transmission-gate transistors are constructed within are portions of a single well.

13. A voltage boosting circuit constructed along a surface of a monolithic integrated circuit substrate, said voltage boosting circuit comprising:

a boosting node;

at least a first isolation well formed in said surface of said substrate;

first and second oscillating circuits for supplying first oscillations and second oscillations, respectively;

a main pumping circuit for boosting an input voltage to generate a boosted input voltage at an output connection of said main pumping circuit, said main pumping circuit driven by said first oscillations;

a transmission-gate circuit that is selectively conductive for applying said boosted input voltage from the output of said main pumping circuit to said boosting node, said selectively conductive transmission-gate circuit constructed along the portion of said surface of said substrate in which said first isolation well is formed; and a well bias supplying circuit for supplying a bias potential to said first isolation well, said well bias supplying circuit driven by said second oscillations, wherein said well bias supplying circuit comprises:

a first inverter connected for receiving said second oscillations from said second oscillating circuit and supplying an inverted response to said second oscillations as an output signal therefrom;

a second inverter in cascade connection with said first inverter for receiving its said inverted response to said second oscillations and supplying a twice-inverted response to said second oscillations as an output signal therefrom;

first and second capacitors having respective first plates connected together to receive the output signal of said first inverter and having respective second plates;

third and fourth capacitors having respective first plates connected together to receive the output signal of said second inverter and having respective second plates;

respective resistive elements for applying bias voltage to the second plates of said first, second, third and fourth capacitors;

a first diode-connected transistor, connected between the second plate of said first capacitor and the second plate of said third capacitor, and poled for applying charged voltage at the second plate of said first capacitor to the second plate of said third capacitor when the charged voltage at the second plate of said first capacitor sufficiently exceeds voltage at tho second plate of said third capacitor;

a second diode-connected transistor, connected between the second plate of said third capacitor and said first isolation well, and poled for applying charged voltage at the second plate of said third capacitor to said first isolation well when the charged voltage at the second plate of said third capacitor sufficiently exceeds said bias potential at said first isolation well;

a third diode-connected transistor, connected between the second plate of said fourth capacitor and the second plate of said second capacitor, and poled for applying charged voltage at the second plate of said fourth capacitor to the second plate of said second capacitor when the charged voltage at the second plate of said fourth capacitor sufficiently exceeds voltage at the second plate of said second capacitor; and a fourth diode-connected transistor, connected between the second plate of said second capacitor and said first isolation well, and poled for applying charged voltage at the second plate of said second capacitor to said first isolation well when the charged voltage at the second plate of said second capacitor sufficiently exceeds said bias potential at said first isolation well.

14. The voltage boosting circuit recited in claim 13, wherein said second oscillating circuit is arranged to supply second oscillations beginning at a time before said first oscillating circuit begins to supply first oscillations.

15. The voltage boosting circuit recited in claim 13, wherein said substrate is formed from p-type semiconductive material; wherein said first isolation well is formed from n-type semiconductive material; and wherein said selectively conductive transmission-gate circuit includes a PMOS transistor that has a gate, has a source connected to the output connection of said main pumping circuit, has a drain connected to said boosting node, and has a channel induced within said first isolation well between its said source and said drain responsive to voltage pulses applied to its said gate electrode concurrently with said boosted input voltage being generated at the output connection of said main pumping circuit, said channel of said PMOS transistor being selectively conductive responsive to said voltage pulses.

16. The voltage boosting circuit recited in claim 15, wherein said second oscillating circuit is arranged to supply second oscillations beginning at a time before said first oscillating circuit begins to supply first oscillations.

17. The voltage boosting circuit recited in claim 13 in combination with a semiconductor memory device circuit constructed along said surface of said monolithic integrated circuit substrate and powered by said boosted input voltage supplied to said boosting node.

18. The voltage boosting circuit recited in claim 17 wherein said first oscillating circuit supplies first oscillations in response to receiving a level detecting signal indicating boosted voltage at said boosting node is too low; and wherein said well bias supplying circuit supplies a prescribed value of said bias potential to said first isolation well in response to said second oscillations, before said boosting voltage main pumping circuit executes a pumping operation in response to said first oscillations.

* * * * *